(12) United States Patent
Janzén et al.

(10) Patent No.: US 10,017,877 B2
(45) Date of Patent: Jul. 10, 2018

(54) SILICON CARBIDE CRYSTAL GROWTH IN A CVD REACTOR USING CHLORINATED CHEMISTRY

(71) Applicant: EPILUVAC AB, Lund (SE)

(72) Inventors: Erik Janzén, Linköping (SE); Olof Kordina, Vikingstad (SE)

(73) Assignee: EPILUVAC AB, Lund (SE)

( * ) Notice: Subject to any disclaimer, the term of this patent is extended or adjusted under 35 U.S.C. 154(b) by 833 days.

(21) Appl. No.: 14/375,289

(22) PCT Filed: Jan. 29, 2013

(86) PCT No.: PCT/SE2013/050066
§ 371 (c)(1),
(2) Date: Jul. 29, 2014

(87) PCT Pub. No.: WO2013/115711
PCT Pub. Date: Aug. 8, 2013

(65) Prior Publication Data
US 2015/0013595 A1 Jan. 15, 2015

(30) Foreign Application Priority Data
Jan. 30, 2012 (SE) ...................................... 1230011

(51) Int. Cl.
*C30B 25/14* (2006.01)
*C23C 16/32* (2006.01)
(Continued)

(52) U.S. Cl.
CPC .......... *C30B 25/14* (2013.01); *C23C 16/0236* (2013.01); *C23C 16/325* (2013.01);
(Continued)

(58) Field of Classification Search
CPC ....... C30B 25/14; C30B 25/02; C30B 25/165; C30B 29/36; C30B 25/12; C23C 16/45565; C23C 16/325
See application file for complete search history.

(56) References Cited

U.S. PATENT DOCUMENTS 5,463,978 A * 11/1995 Larkin .................... C30B 25/02
117/102
5,851,589 A 12/1998 Nakayama et al.
(Continued)

FOREIGN PATENT DOCUMENTS

EP 1491662 A1 12/2004
JP H0952796 A 2/1997
(Continued)

OTHER PUBLICATIONS

"Concentric." Merriam-Webster.com. Merriam-Webster, n.d. Web. Oct. 30, 2017. (Year: 2017).*
(Continued)

*Primary Examiner* — Matthew Song
(74) *Attorney, Agent, or Firm* — Venable LLP; Jeffri A. Kaminski

(57) ABSTRACT

A silicon carbide growth method for growing a silicon carbide crystal on a substrate in a hot wall reaction chamber heated to a temperature between 1600° C. and 2000° C. Process gases enter the reaction chamber utilizing at least a primary gas flow, a secondary gas flow, and a shower gas flow. The shower gas flow is fed substantially perpendicularly to the primary and secondary gas flows and is directed towards the substrate. The primary and secondary gas flows are oriented substantially parallel to the surface of the substrate. A silicon precursor gas is entered by the primary gas flow. A hydrocarbon precursor gas is entered in at least one of the primary gas flow, the secondary gas flow, or the shower gas flow. Hydrogen is entered primarily in the
(Continued)

secondary flow and the shower head flow. A CVD reactor chamber for use in processing the method.

13 Claims, 1 Drawing Sheet

(51) Int. Cl.
*C23C 16/455* (2006.01)
*C30B 25/02* (2006.01)
*C30B 25/16* (2006.01)
*C30B 29/36* (2006.01)
*C23C 16/02* (2006.01)
*C23C 16/458* (2006.01)

(52) U.S. Cl.
CPC ........ *C23C 16/455* (2013.01); *C23C 16/4584* (2013.01); *C23C 16/4586* (2013.01); *C23C 16/45504* (2013.01); *C23C 16/45565* (2013.01); *C23C 16/45568* (2013.01); *C23C 16/45576* (2013.01); *C30B 25/02* (2013.01); *C30B 25/165* (2013.01); *C30B 29/36* (2013.01)

(56) References Cited

U.S. PATENT DOCUMENTS

| | | | |
|---|---|---|---|
| 6,129,047 A | 10/2000 | Nakamura | |
| 6,184,154 B1* | 2/2001 | Dietze | C23C 16/24 257/E21.136 |
| 6,297,522 B1 | 10/2001 | Kordina et al. | |
| 6,596,079 B1* | 7/2003 | Vaudo | C30B 23/00 117/101 |
| 2004/0022501 A1 | 2/2004 | Lam et al. | |
| 2007/0107654 A1* | 5/2007 | Motakef | C23C 16/303 117/88 |
| 2008/0092812 A1* | 4/2008 | McDiarmid | H01L 21/67017 118/695 |
| 2008/0173239 A1* | 7/2008 | Makarov | C23C 16/32 118/724 |
| 2008/0241387 A1* | 10/2008 | Keto | C23C 16/452 427/255.394 |
| 2011/0278596 A1 | 11/2011 | Aigo et al. | |
| 2011/0285933 A1 | 11/2011 | Cho et al. | |

FOREIGN PATENT DOCUMENTS

WO WO-00/43577 A1 7/2000
WO WO-2005/021842 A2 3/2005

OTHER PUBLICATIONS

M. Asghar, et al., "Study of deep level defects in doped and semi-insulating n-6H-SiC epilayers grown by sublimation method", Physica B 407 (2012) 3038-3040.
A.Y. Polyakov, et al., "Halide-CVD Growth of Bulk SiC Crystals", Materials Science Forum vols. 527-529 (2006) pp. 21-26.
F. La Via, et al., "High growth rate process in a SiC horizontal CVD reactor using HCl", Microelectronic Engineering 83 (2006) 48-50.
Stefano Leone, et al., "Chloride-Based SiC Epitaxial Growth toward Low Temperature Bulk Growth", DOI: 10.1021/cg1005743, Jun. 18, 2010 American Chemcial Society, Published on Web Jun. 18, 2010.
E. Janzén, et al., "Chloride-Based SiC Growth", Linköping University, ref. No. IFM-2010-00154, p. 8, §4—pp. 1-10, Dec. 13, 2010.

* cited by examiner

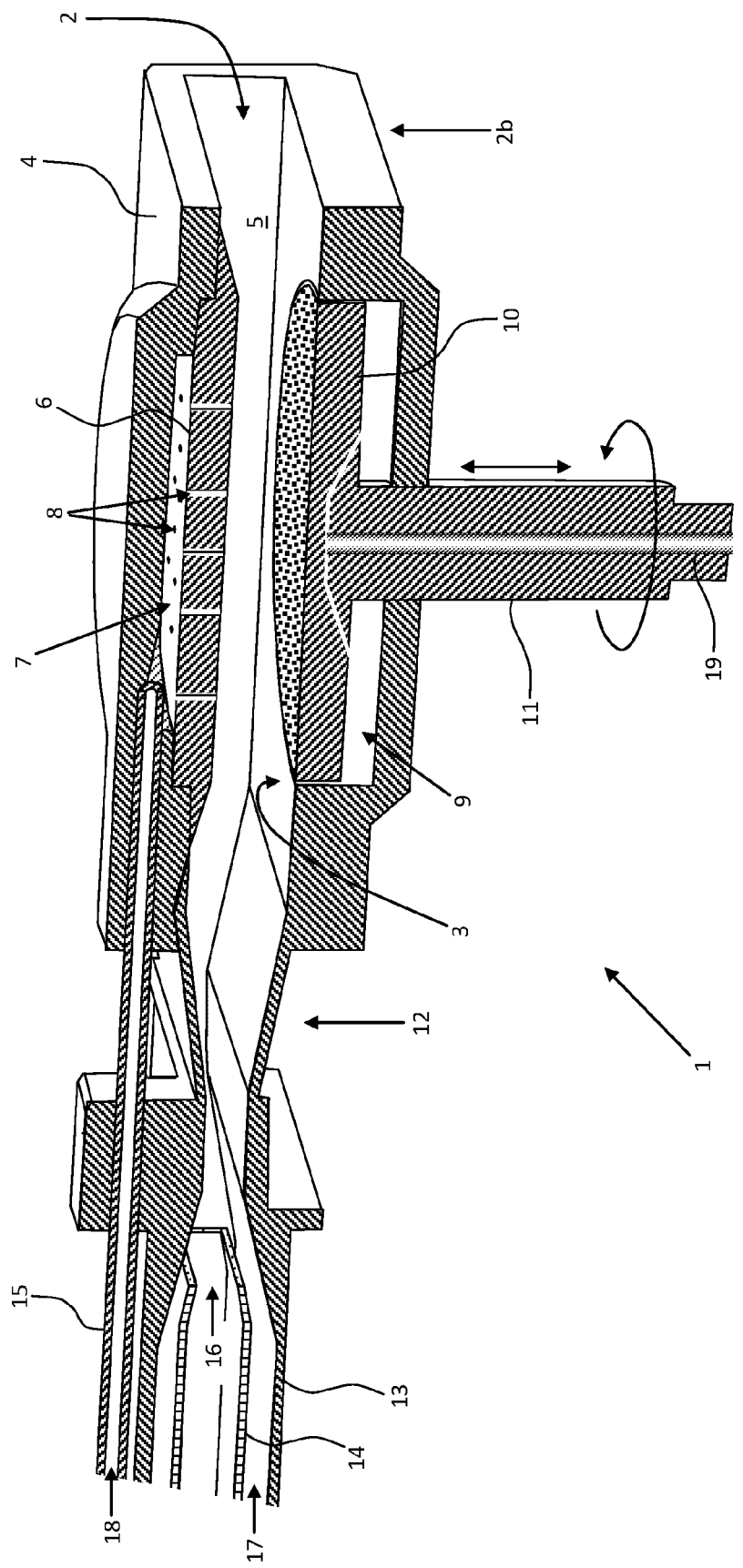

SILICON CARBIDE CRYSTAL GROWTH IN A CVD REACTOR USING CHLORINATED CHEMISTRY

CROSS-REFERENCE TO RELATED APPLICATIONS

The application claims priority to Swedish patent application 1230011-7 filed 30 Jan. 2012 and is the national phase under 35 U.S.C. § 371 of PCT/SE2013/050066 filed 29 Jan. 2012.

TECHNICAL FIELD

The present invention is related to growth of silicon carbide crystals in a CVD reactor, where the crystal is grown in an atmosphere containing chlorine species. The field of the invention is further related to a reactor wherein a main flow of reactor gases flows parallel to the crystal surface. The invention is directed to a device for said growth as well as a method for the growth of the crystal.

BACKGROUND ART

SiC material properties give SiC technology advantages over existing Si and III-V technology in the form of very high blocking voltages, high switching frequency, lower on-state and switching losses. SiC has the potential to replace the currently dominating materials in most low- and high-frequency power devices, once the material problems have been mastered. SiC based power electronics will drastically reduce the power losses in most distribution and generation systems for electrical energy as well as in electrical motors.

Semiconductor materials used in almost all electronic semiconductor devices consist of epitaxial layers grown on top of a substrate, sliced from a bulk grown ingot.

SiC cannot be grown from a melt like conventional semiconductors Si and GaAs. Instead vapour phase has to be used. The most common SiC bulk growth technology is based on Physical Vapor Transport (PVT). We have earlier developed an alternative technology based on High Temperature CVD (HTCVD).

Essentially all SiC material sold today is grown by the PVT technique. It is a very simple technique which produces good quality crystals at reasonable yields. However, the technique has also severe limitations and draw backs. It is in essence a container with SiC powder inside it. The container has a lid with a seed attached to it. The container is placed in a furnace such that a thermal gradient is manifest axially with the seed at the coldest spot. At temperatures in excess of 2000° C., silicon carbide starts to sublime appreciably and material transport will occur from the hot source to the colder seed. Growth temperatures are normally around 2100-2400° C. on the seed. Growth pressures are normally around 10 torr which gives an average growth rate around 0.3 mm/h.

Generally, PVT growth starts with a very long heat-up phase followed by a growth phase and a cool down phase that in some cases lasts for a full day. The growth rate during the growth phase also varies as the stoichiometry and axial gradients change. The highest quality material is obtained with very low growth rates (less than 0.3 mm/h) during the growth phase, however if the whole cycle is taken into account, the growth rate will be lower.

The extreme growth temperatures take a high toll on the hot zone consumables and it requires significant amounts of energy to heat and maintain the high temperatures. The sublimation of SiC is not stoichiometric as Si leaves the source first making the growth very Si rich in the beginning, to gradually become more balanced, but end up C rich. This is particularly vexing when high purity semi insulating (SI) crystals are grown as they tend to be n-type at the start and p-type at the end with a very small band of SI material in the middle. The high Si pressures at the start of the growth have severe implications on the way the rest of the SiC crystal grows. Often, polytype flipping caused by the high Si overpressures occur with dislocations and/or micropipes associated with them.

In summary, the PVT technique is a robust technique which gives slow progress in terms of material quality. Higher quality material is very expensive and difficult to produce. The high growth temperature makes the technique expensive in terms of consumables.

HTCVD is a different technique where control is very precise. The HTCVD is also a sublimation technique and hence incorrectly named as a CVD technique at high temperatures. The technique was named before the process was fully understood, hence the unfortunate choice of name. In principle, the technique has replaced the source powder with gases.

Normally, silane and ethylene are used together with helium as a carrier gas. The silane and ethylene decompose and react already in the entrance zone where an injector is placed. The reaction forms micro-crystals of $Si_xC_y$. These microcrystals are very stable and move into the hot zone where they sublime to form the normal sublimation species Si, $Si_2C$, and $SiC_2$. At the colder seed these species will condense and grow the crystal as in the PVT case. The control is very precise in the HTCVD and the purity is outstanding, however it is hampered by drift issues and poor reproducibility giving rise to poor yields.

In theory, the HTCVD technique should be a cheaper alternative compared to the PVT, however, the current low yields of the process makes it a significantly more expensive technique suitable only for ultra high purity. Growth rates are roughly the same as in the PVT case, roughly 0.3 mm/h. The control makes it also nice in terms of obtaining better structural quality. Indeed, more than 50% of the micropipes originating from the seed are normally closed after a run in a HTCVD-process.

However, both the PVT and HTCVD techniques operate at extreme temperatures where the formation of dislocations and subsequently micropipes is much more probable. Compared to regular CVD where the micropipes more often than not are closed, no new micropipes are formed, and dislocation densities generally decrease with increasing thickness of the layers. More serious is the radial thermal gradients over the growing crystal. If there is no radial gradient over the crystal the risk of obtaining a concave crystal (higher growth rate on the edge than in the center) will be high and is therefore not a desirable situation. In the start up the crystal can also have higher growth rates locally which are caused by variations in the seed attachment. A concave or locally concave crystal will give extremely poor quality material with high stresses and a high density of dislocations. A high radial thermal gradient yielding a convex crystal is not good either as the growth takes place at high temperatures. The structural properties (mainly the lattice spacing) will be different during the growth on material grown on the edge as compared to material grown in the center. When the crystal is cooled down there will be stresses built in which in some cases causes the crystal to crack or it will produce dislocations. The growth of crystals using PVT and to a major extent also when using HTCVD is largely governed by thermal gradients which makes structural imperfections and stresses very hard to avoid. The ideal situation is to grow the crystal without any thermal gradient but to somehow establish a crystal shape that is very weakly convex.

Regarding epigrowth, hydrogen chloride gas (HCl) was first used prior to the growth as an etching process, similarly as in the Si growth. However, already in the year 2000, HCl was used to remove the physicochemical problem, i.e. liquid silicon droplets, which limit the growth rate. The use of chlorinated silicon precursors or simply the addition of HCl or chloride related precursor was suggested in the literature. See, for example, U.S. Pat. No. 7,247,513.

Once chlorinated epitaxy of SiC started to be used, it did not take long before extreme growth rates could be achieved. One of the first studies reported growth rate up to 90 µm/h with methyltrichlorosilane as precursor. HCl was also added to a standard SiC epitaxial growth process using $SiH_4$ and $C_3H_8$ to obtain growth rate at about 20 µm/h. Higher growth rates were also obtained, however with a degradation of the morphology. Using $SiCl_4$ and $C_3H_8$ as precursors, high growth rates (>100 µm/h) were achieved. With the introduction of HCl in the deposition chamber the growth rate of 4H—SiC epilayer could be increased by a factor of about 20. The introduction of other chlorine containing species has also been tried including chlorosilane gases, such as trichlorosilane. Finally, growth using chloromethane ($CH_3Cl$) as carbon precursor instead of $C_3H_8$ has shown an increase of the obtained growth rate with a factor of 2.

There are only two serious attempts of crystal growth using a chlorinated chemistry. Polyakov and coworkers reported the used of chlorinated silicon precursor in conjunction with gaseous hydrocarbon (first with propane: ($C_3H_8$), and later with methane ($CH_4$)) for the growth of single crystals (Polyakov et al, Mat. Sc. For. 527, 21 (2006)). They used the advantage of the HTCVD, changing the Si precursor from silane to silicon tetrachloride ($SiCl_4$), split the silicon and carbon flows, and called this technique high temperature Halide Chemical Vapor Deposition (HCVD). Splitting the flow was an elegant trick to retard the decomposition of the $SiCl_4$. The carrier gas for the $SiCl_4$ was Ar and the gas was flowing along the outer conduit of a coaxial injector. In the inner injector the hydrocarbon was passed together with hydrogen. The Ar flowing on the outside would also provide thermal insulation to the hydrocarbon to reduce parasitic deposits of carbon on the walls of the injector. To keep the stability of the 4H polytype the growth temperature was about 2100° C. and the used growth rate 100 µm/h. Growth rate close to 300 µm/h was reported for the 6H polytype. In essence, the technique is elegant but not very practical. None of the issues related to HTCVD have been solved. No thick crystals have been demonstrated and the growth rate of the 4H polytype is very low. Thermal gradients were still manifest and necessary to obtain growth. Additional documents describing prior art are: U.S.2011285933, U.S. Pat. No. 6,297,522, and WO0043577.

A relevant prior art document is a report of a Research program: E. Janzén, O. Kordina, Chloride-based SiC growth, Linköping University, ref. no. IFM-2010-00154. Page 8, § 4 mentions the outline of a horizontal reactor, but details to make the reactor work practically were not known.

A.
A further prior art document is: S Leone, F C Beyer, A Henry, C Hemmingsson, O Kordina, and E Janzén. Chloride-based SiC epitaxial growth toward low temperature bulk growth. Crystal Growth and Design, 10(8):3743-3751, 2010.

DESCRIPTION OF THE INVENTION

The present invention relates to growth of silicon carbide crystals in a CVD reactor, where the crystal is grown in an atmosphere containing chlorine species. In the reactor according to the invention a main gas flow is oriented substantially parallel to the surface of a substrate where the crystal is grown. The invention is directed to a device for said growth as well as a method for the growth of the crystal.

Simulation tools show that it is possible to optimize the behavior of the chemical reactions and experiments performed verify the simulations. As an example; one of the designs simulated is to use a chlorosilane and/or methylchlorosilane together with ethylene and Argon and let these gases pass over a seed horizontally. Decomposition of the chlorosilane will be negligible without the presence of hydrogen. Hot hydrogen will be supplied from above the wafer through a fine showerhead. The decomposition of the chlorosilane will occur right above the seed. Using suitable flows and temperature almost all of the deposits can be focused to around the seed, thus minimizing parasitic deposits before and after the seed. Such a configuration can also contribute to make the crystal shape correct through a smart design of the shower head introducing the hot hydrogen. This is a main principle of the invention and in the following a method and a device for reducing these ideas into practice is disclosed.

Chemical Vapor Deposition of SiC using a chlorinated chemistry has shown tremendous advantage in terms of producing very high quality material at unprecedented growth rates. At temperatures as low as 1600° C., growth rates of 200 µm/h have been demonstrated in a horizontal hot wall reactor. The same chemistry was tried in a vertical arrangement with the flow of gases perpendicular to the crystal surface. The deposit was then polycrystalline. A temperature of 1850° C. was required to obtain a layer of good crystalline quality. The explanation lies in the gas flow, which apparently cools the surface of the growing crystal. This could also be verified from the shape of the crystal, which was heavily dome shaped with significantly higher growth rate in the center of the crystal. Spreading the flow through a diffuser or similar proved to be bad as the growth rate completely disappeared. The flow was needed in order to get the precursors to the growing crystal but it also proved to be bad due to the cooling.

According to the present invention it is therefore disclosed that a horizontal orientation of a reactor for the growth is preferred as there is no cooling by the gas jet. Yet, precursors can be brought close to the surface of the grown crystal by a reduction of the boundary layer. A thin boundary layer (or stagnant layer) is formed under laminar flow conditions if the flow is high or pressure is low. A problem with prior art examples of a horizontal orientation of the reactor is that substantial deposition will occur upstream of the seed. This is not a problem when layers up to perhaps 200 µm are grown, but for thicker layers or crystals of several mm in length, a buildup due to deposition upstream and downstream of the crystal would be a problem.

To solve the upstream buildup, a chemistry using a chlorosilane, for instance $SiCl_4$, as the silicon precursor is preferred. $SiCl_4$ is the most suitable choice as this molecule is very stable. It is particularly stable in the absence of hydrogen, thus, according to the invention, the $SiCl_4$ precursor gas is best transported in an inert carrier gas with predominantly Ar as the carrier gas. Ar is chosen rather than He on account of the lower cost and also due to the low thermal conductivity which makes it even less prone to decompose as the temperature in the gas phase of the process will be lower. Helium may also be used as the carrier gas, but a drawback is that its thermal conductivity is close to that of hydrogen. A mix of He and Ar may be used in order to perfectly balance the temperature in the gas phase.

The carbon precursor is preferably propane, ethylene, methane, or methylchloride which are common precursors in regular CVDs. When these are transported in an inert gas or by themselves, they decompose thermally which usually results in carbon deposits or deposits of pyrolytic graphite. When transported in hydrogen, however, these gases will decompose and form other hydrocarbons specific to the ambient temperature. So, according to one aspect of the invention, some hydrogen should be used with the chosen hydrocarbon in order to prevent parasitic deposition of carbon. The specific carbon chemistry to choose depends much on the temperature. Methane is an excellent choice due to its stability which will contribute to avoid parasitic depositions, however, methane is not suitable in the low temperature regime, i.e. between 1500° C. and 1700° C., where it generally produces very rough and low quality layers. At higher temperatures, above 1700° C., methane would be a much more suitable choice. In the low temperature regime, methylchloride or ethylene would be the best choice. Propane decomposes very easily and is perhaps not the best choice but could likely be used if the amount of hydrogen in the carrier flow is high enough, i.e. more than about three to ten times the flow of the hydrocarbon flow. Thus, preferably, the main flow of gas will be silicon tetrachloride, ($SiCl_4$), ethylene ($C_2H_4$) as precursor gases, and Argon (Ar), Hydrogen ($H_2$), and optionally some Helium (He).

$SiCl_4$ will decompose into $SiCl_2$ which at these temperatures is a stable species, shown to be very useful for the growth. In order to speed up this reaction, hydrogen should be added in substantial amounts. Trichlorosilane (TCS) may also be used, however this molecule is not as stable as the $SiCl_4$ and may decompose too early giving rise to parasitic depositions upstream of the crystal. Yet this molecule and other chlorosilanes (or methyltrichlorosilane) may come in question in the lower temperature regime, i.e. between 1500° C. and 1700° C. since the $SiCl_4$ may prove too stable at these temperatures and hence on the inefficient side. To control the reaction rate of the chlorosilanes, hydrogen can be added to the main flow in small amounts (about 1 to 10 times that of the flow of the chlorosilanes). The hydrogen will speed up the reaction and increase the thermal conductivity of the gas mixture thereby increasing the reaction speed. Dichlorosilane is also a potential molecule that may be used but this is thermally very reactive and will give rise to deposits upstream of the crystal. The hydrogen will help by forming bonds with the chlorine from the $SiCl_4$ to form HCl. Hydrogen is, according to the invention added from above in the reactor, preferably added through a shower head right above the substrate where hydrogen is preheated in a hot susceptor (reaction chamber) ceiling and flows down towards the substrate where the crystal is grown. This flow of hydrogen must not be too large, so that it is not allowed to create a cooling effect. Yet, the flow of hydrogen should be directed with care, so that a good crystal shape can be obtained, i.e. slightly dome shaped. In a further embodiment of the invention, hydrogen is, as a complement, added as a secondary flow coaxially around the primary flow of precursors and carrier gases. The two flows, primary flow and secondary flow, must not meet too close to the primary flow and secondary flow inlets, because then reactions between gases of the two flows will occur too early. Being a great advantage, this arrangement will prevent the primary flow from reaching the surfaces of the susceptor and thus reduce buildup of material prior to the substrate. A combination of coaxial hydrogen (secondary flow) and perpendicularly flowing hydrogen through a shower head and being directed to the substrate is the most preferred arrangement. In a further embodiment, hydrogen is added to the main flow to increase the reactivity of the silicon precursor and to increase the temperature in the main flow. A predetermined proportion between the hydrogen flow parts of the secondary flow and the perpendicular flow is of importance for avoiding buildup of deposits and to reach the optimal growth conditions around the substrate. The flow in the secondary flow may be between three times that of the silicon precursor flow and up to 50 times that of the silicon precursor flow. The flow from the perpendicular flow may be between one time that of the silicon precursor flow to twenty times that of the silicon precursor flow. The flows of course depend much on the temperature used, the geometry and size of the reaction chamber, and the precursor selection.

The crystal should be rotated (for uniform growth) and be pulled downwards as the crystal grows. To keep a rotating seed holder free from deposits, an etch gas consisting of HCl and hydrogen may be introduced. This will attack the SiC, but when the etch gas enters the main gas stream it will lose its etching ability and simply dilute the main gas mix making it slightly more chlorine rich and hydrogen rich. The ideal situation is likely to add the etch gases with some Ar as well. Too high chlorine content in the main gas stream is not good as it will reduce the growth rate especially at high growth temperatures.

Downstream of the growing crystal it is also preferable to add an etch gas e.g. through a porous graphite plate with large pores. Again, the etch mix is only effective for as long as it is not mixed with the main gas stream. Downstream of the crystal it is not necessary to worry about too high chlorine content in the gas as deposits are to be avoided.

One main advantage of a crystal growth according to the invention is that the temperature can be kept between 1600-2000° C. and parameters for gas flows set, such that growth rates between 0.2-0.5 mm/h can easily be reached. A further great advantage is that radial and axial thermal gradients over the crystal will also be minimal thus greatly reducing the formation and evolution of dislocations in the material. The growth rate will entirely be governed by the flow and reaction of the gases rather than by thermal gradients as is the case in the prior art crystal growth techniques.

In view of the high growth rates which approach those of bulk growth which is done at much higher temperatures, it is really surprising that crystal growth of SiC is not performed with a chlorinated chemistry. The advantages are apparent as almost all the micropipes will be closed, dislocation densities will be much lower, and the purity will be of device quality. By the use of the process as described it will be possible to reach crystals possible to slice and polish, and to use the wafer itself as an active layer. Then it is only needed to put a p-type layer on one side and an n-type layer on the other side of the wafer. The blocking voltage of such structures would be roughly 10-30 kV depending on how thick the wafers are cut and the doping they have.

BRIEF DESCRIPTION OF THE DRAWING

The FIGURE shows in a lengthwise cross section a perspective view of a horizontally arranged reactor for use according to the method of the invention.

DESCRIPTION OF EMBODIMENTS OF THE INVENTION

Below, a number of variants of embodiments of the invention are described and supported by the enclosed FIGURES.

The method for growth of silicon carbide in a reactor, preferable horizontally arranged, according to the invention, is performed in an exemplified reactor as disclosed in the embodiment illustrated in the FIGURE. In the FIGURE a reaction chamber 1 is depicted in a perspective view. The reaction chamber 1 together with inlet tubes for introducing precursor gases, carrier gases and in this case also shower gases are disclosed in a lengthwise cross section. Thus only the far half of the reaction chamber and its inlet tubes are shown in the FIGURE, but an anterior half, symmetric to the far half, is easily understood. The FIGURE is further not showing heating means for the reaction chamber 1. The reaction chamber is of the hot wall type and can be heated by means of an RF coil around and along the reaction chamber as is known from prior art devices. Other means for heating the reaction chamber 1 are possible to use, i.e. resistive heating means arranged around the reaction chamber. The notation "horizontal reactor" is used based on the fact that the main part of the gases flowing through reaction chamber 1 flows horizontally and parallel to the crystal surface. A vertical arrangement may be envisioned, however the crystal surface must then be attached to the walls of the reactor such that the main flow is parallel with the crystal surface. There are advantages with a vertical arrangement such that the footprint of the reactor can be reduced and, if the flow is introduced from the bottom, the boundary layer will be thinner due to the fact that the buoyancy of the gas will act in concert with the main flow. Yet the simplicity of loading and unloading the horizontal reactor arrangement outweigh the advantages of the vertical arrangement.

The reaction chamber 1 is designed as an elongated reaction room 2 enclosed by a bottom wall 3, a top cover 4, and side walls 5 connecting bottom and top cover. Only the far side wall 5 can be seen in FIGURE. The walls enclosing the reaction chamber 1 may be made, as an example, by graphite coated with silicon carbide or tantalum carbide. The top cover 4 has in its center an elevation, preferably circular, thus establishing a cavity in the top cover 4. In the lower section of this cavity, a shower head 6 is mounted. The shower head 6 acts as a top wall of reaction chamber 1 at least in the area occupied by the shower head 6. Between the top cover 4 and the shower head 6 a gas chamber 7 is established. Further, the shower head 6 is provided with narrow channels 8 connecting the gas chamber 7 and the interior of reaction chamber 1, i.e. reaction room 2. Said narrow channels 8 are provided in a desired number over the area of the showerhead. The opening to the right in the FIGURE is a reaction chamber outlet 2b for the discharge of used process gases.

At the bottom wall 3 of the reaction chamber 1 there is a cavity 9. Inside this cavity a substrate holder 10 is arranged to be flush with the upper level of the bottom wall 3. The substrate holder 10 is mounted on top of a holder axle 11, which is inserted through the bottom wall 3 in the center of the bottom wall cavity 9. This arrangement allows for rotation of substrate holder 10. The reason for rotation of the substrate holder 10 is to get as uniform growth as possible of a crystal arranged to grow on the substrate holder. The holder axle 11 can further be slided in a vertical direction up or down to permit the substrate holder to be lowered in pace with a height growth of a crystal on the substrate holder 10.

The reaction chamber 1 has an inlet 12. A secondary gas conduit 13 is connected to said inlet 12 of reaction chamber 1. In the depicted design of secondary gas conduit 13, it is shown to have a rectangular design. Deviations from this are of course possible and depending on the desired gas flow configuration in a final mix of gases entering the reaction chamber 1. Inside the secondary gas conduit 13, a primary gas conduit 14 is set up. Preferably, said primary gas conduit 14 and the surrounding secondary gas 13 conduit have symmetrical cross sections and being equidistantly arranged in relation to each other to ensure a uniform flow of gases when entering the inlet 12 of reaction chamber 1. A mouth of the primary gas conduit (14) is located ahead of a constriction prior to the inlet 12. The location of said mouth can be adjusted lengthwise to arrive at a proper linear flow of gases when the gases from primary gas conduit 14 and secondary gas conduit 13 meet at the inlet 12.

A shower gas tube 15 runs through the reactor top cover 4 and connects to gas chamber 7. By this arrangement a shower gas sent through shower tube 15 enters gas chamber 7 and will be discharged from gas chamber 7 through the narrow channels 8 of the shower head 6. Shower gas from shower head 6 will thus be directed substantially perpendicular to gas flows from primary gas conduit 14 and secondary gas conduit 13. It should be mentioned here that modified design of the narrow channels 8 may be advantageous. If a specific pattern of shower gas is wanted, for example, at an outer border of the substrate holder, the narrow channels 8 may be designed to be perpendicular or being inclined in relation to the surface of the substrate, or provided in a more dense/sparse number at these locations. Further, the narrow channels 8 may have different cross sectional areas at different locations of the shower head area. Additionally the showerhead may be replaced by a porous disc, preferably in the centre part of the showerhead. This disc would soften the flow a bit and enable a higher amount of hydrogen to be introduced through this conduit which would aid the crystal shape and reactivity.

The process to grow a silicon carbide crystal as described above by use of the reactor of the FIGURE is disclosed in the following. The process can be performed according to different alternatives of use of gases for the growth. In the process there are three flows of gases. These are denoted: primary gas flow 16 conveyed through primary gas conduit 14, secondary gas flow 17 conveyed through secondary gas conduit 13, and shower gas flow sent through shower gas conduit 18.

A seed SiC crystal is placed on the substrate holder. The process starts with heating the hot wall reactor in a known manner. The reaction chamber is heated to a temperature between 1600° C. and 2000° C. In a following step gases are let in to the reaction chamber 1.

The use of process gases for the growth can be arranged to one of the following alternatives:

1. Hydrocarbons are introduced together with silicon tetrachloride $SiCl_4$ in the main gas flow (by main gas flow is meant the sum of primary and secondary gas flows). As hydrocarbon always must be conveyed together with a certain amount of hydrogen, a small amount of hydrogen is also sent as a part of the main gas flow (approximately three to ten times the flow of the hydrocarbon flow). When hydrogen is flowing together with SiCl$_4$, the hydrogen will of course affect the SiCl$_4$ gas, whereupon this gas will crack early in the gas flow. This is not necessarily a drawback, but can instead be looked upon as a way to control the reaction rate. Anyhow, the basic principle is that SiCl$_4$ is transported together with Argon as the carrier gas in the primary flow. Accordingly, in this alternative, SiCl$_4$, hydrocarbon, a carrier gas which is preferably Argon, and a small amount of hydrogen are introduced as the primary gas flow 16. As already discussed, the carrier gas may be a mix of Ar and He. Further, according to this alternative, a specific rate of hydrogen is also introduced in the secondary flow 17 surrounding primary gas flow 16 as the shield of hydrogen discussed above. Still further, according to this alternative, the main part of hydrogen is introduced in the reaction chamber 1 as a gas flow directed towards the substrate holder 10 perpendicular to the main gas flow. The hydrocarbon mentioned here is preferably C$_2$H$_4$, but could be C$_2$H$_2$, CH$_4$, C$_3$H$_8$, C$_2$H$_6$, CH$_3$Cl or a mix of any of these hydrocarbons. The hydrocarbon used is further depending on the desired growth temperature. The concentration of the hydrocarbon is preferably about the same as the silicon precursor. Experiments show that the best quality material is obtained if the C/Si ratio is kept close to 1 or slightly below 1. The concentration of the silicon precursor or the Si/H$_2$ ratio is between 0.1% and 10%. The H$_2$/Ar ratio should be between 1 and 50. Absolute flows of the silicon precursor is not meaningful to give as it depends greatly on the temperature, the exact geometry and size of the reaction zone, and which precursor is selected. The Cl/Si ratio is also an important parameter. In the suggested temperature regime, etch effects may be noticed for Cl/Si ratios above 3-5. A Cl/Si ratio of 10 will definitely be high and etch effects will be noticed. In this case, extra HCl must be added to the flow. Some HCl will come from an etch gas flow (see below) and combine with the main flow and add to the Cl/Si ratio. Some etching of the growing crystal may not be entirely bad as the etching will predominantly be on parts of the crystal showing lower crystalline perfection, however, if the etching is too high i.e. at high Cl/Si ratios and at high temperature, the growth rate will be markedly lower. A Cl/Si ratio below 2 is not recommended as the risk to form Si droplets will be very high.

2. The hydrocarbon is separated from SiCl$_4$ and is transported together with hydrogen as the secondary flow 17. In this case the SiCl$_4$ is conveyed together with the carrier gas, which also in this alternative is Ar or a mix of Ar and He or Ar and H$_2$. The shower gas flow 18 content is the same as in alternative 1. The hydrocarbons can also be chosen as in alternative 1.

Concentrations should be chosen same as in alternative 1

3. The hydrocarbons are in this alternative conveyed to the reaction chamber 1 together with the main part of the hydrogen flow in shower gas flow 18 and will accordingly flow perpendicularly to the main flow towards the crystal grown on a substrate attached to the substrate holder 10. The SiCl$_4$ gas is conveyed as previously as the primary gas flow 16 together with Ar or a mix of Ar and He or Ar and H$_2$. The secondary gas flow 17 may in this case consist of hydrogen only but some Ar could be used here also to prevent the diffusion of Si-species to the walls. The diffusivity through Ar is low and it may for this reason be used to shield the Si-species from the hot walls where they may deposit as Si. The main part of hydrogen is however led through the shower gas tube 15 together with the hydrocarbon.

Concentrations should be the same as in alternative 1 and 2.

As discussed previously, silicon tetra chloride is chosen as the chlorine silicon source in the process described. Other silicon sources, in this case chlorine containing silicon precursors could be chosen, if desired, such as trichlorosilane, dichlorosilane, monochlorosilane, silane and methyltrichlorosilane. Dichlorosilane, monochlorosilane, and silane decompose quite easily thermally. These precursors will need some additional HCl added to prevent Si droplet formation especially at high concentrations.

A small ratio of hydrogen can also in alternatives 2 and 3 be brought together with the silicon source in the primary gas flow 16. The purpose of this would be to start the reactions between hydrogen and the silicon source a bit earlier. This would be preferable at lower reaction temperatures (starting from 1600° C.).

In the alternatives according to the embodiments described the shower gas discharged from shower head 6 is preheated as this gas passes the shower head chamber 7, which is kept at the predetermined reaction temperature. The reactor wherein reaction chamber 1 is located is a hot wall reactor, whereby the walls and the top cover 4 are all kept at the process temperature.

The perpendicular flow of hydrogen from the wall facing the substrate on the substrate holder will speed up the gas phase reactions and also ensure that a good crystal shape is maintained.

The hydrogen "coaxial" flow at the perimeter of the main flow is arranged to prevent parasitic depositions but also to help the gas phase reactions. Etch gas, HCl and H$_2$ in moderate amounts will not disturb the growth in any particular way. These are entered through a center channel 19 of a substrate holder shaft 11 and passed through conduits in substrate holder 10 to fill the cavity 9 and exit in the gap between the bottom wall 3 and the substrate holder 10. The process describes a crystal growth technique with zero or minimal thermal gradients and producing material quality equal to the best epitaxial material. The process is further a low temperature crystal growth method with no sublimation, thus a pure CVD-process.

The process pressure is preferably selected to be fairly low as the boundary layer will be thinner because the velocity is high. However at a too low pressure there is a risk that the reaction will not occur and the precursor gases will be swept out unreacted. A process pressure between 50 mbar up to atmospheric pressure is suitable. A smaller range could be 75 mbar to 600 mbar and an even smaller range between 100 mbar and 400 mbar. Etch effects also become more significant at pressures below 200 mbar so the pressure may advantageously be slightly higher at higher temperatures and/or at high Cl/Si ratios.

The invention claimed is:

1. A silicon carbide growth method for growing a silicon carbide crystal on a substrate in a hot wall reaction chamber, wherein the reaction chamber is heated to a temperature in the region 1600° C. to 2000° C., the method comprising:
   entering process gases into the reaction chamber by use of at least three gas flows, a primary gas flow, a secondary gas flow surrounding the primary gas flow, and a shower gas flow, wherein said primary and secondary gas flows stream substantially parallel to the surface of the substrate, and where the shower gas flow is fed substantially perpendicularly to the primary and the secondary gas flows and being directed towards the substrate, a chlorine containing silicon precursor gas is entered into the reaction chamber utilizing the primary gas flow together with a carrier gas, a hydrocarbon precursor gas is entered into the reaction chamber according to at least one of the following alternatives:

together with the chlorine containing silicon precursor gas and a flow ratio x of hydrogen in the primary flow, together with a flow ratio y of hydrogen, in the secondary flow, together with a flow ratio z of hydrogen in the shower head flow, wherein the flow ratio of hydrogen is in the relation x<y<z;

according to all alternatives hydrogen is entered into the reaction chamber in the secondary gas flow at a flow ratio y, and in the shower gas flow at a flow ratio z, wherein y<z.

2. The method according to claim 1, wherein an etch gas is entered into the reaction chamber utilizing an etch gas flow introduced at the substrate holder.

3. The method according to claim 1, wherein the chlorine containing silicon precursor gas is silicon tetrachloride, $SiCl_4$, trichlorosilane $HSiCl_3$, a chlorosilane, or a methyl-trichlorosilane.

4. The method according to claim 1, wherein the hydrocarbon is at least one of ethylene, $C_2H_4$, $C_2H_2$, $CH_4$, $C_3H_8$, $C_2H_6$, or $CH_3Cl$.

5. The method according to claim 1, wherein the secondary flow is 3 to 50 times the flow of the chlorine containing silicon precursor flow, and the shower head flow is 1 to 20 times the chlorine containing silicon precursor flow.

6. The method according to claim 1, wherein the hydrogen flow part of the main flow including the primary flow and secondary flow is between 1 and 10 times the chlorine containing silicon precursor flow.

7. The method according to claim 1, wherein the pressure inside the reaction chamber is kept at a pressure between 50 mbar and 1000 mbar, between 75 mbar and 600 mbar, or between 100 mbar and 400 mbar.

8. The method according to claim 1, wherein the C/Si ratio of total flow into the reaction chamber is between 0.3 and 1.5, between 0.5 and 1.2, or between 0.7 and 1.0.

9. The method according to claim 1, wherein the $Si/H_2$ total flow ratio is between 0.1% and 10%, and the $H_2/Ar$ total flow ratio is between 1 and 50.

10. The method according to claim 1, wherein the Cl/Si ratio is between 2 and 10 or between 3 and 5.

11. The method according to claim 2, wherein the etch gas is HCl or a mix of HCl and $H_2$.

12. The method according to claim 1 wherein Ar is added as a part of the secondary flow.

13. The method according to claim 1, wherein an amount of HCl is added to the primary gas flow.

* * * * *